(12) United States Patent
Takeuchi et al.

(10) Patent No.: US 10,593,750 B2
(45) Date of Patent: Mar. 17, 2020

(54) COMPOUND SEMICONDUCTOR DEVICE AND METHOD FOR MANUFACTURING THE SAME

(71) Applicant: DENSO CORPORATION, Kariya, Aichi-pref. (JP)

(72) Inventors: Yuichi Takeuchi, Kariya (JP); Atsuya Akiba, Kariya (JP); Katsumi Suzuki, Nagakute (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 11 days.

(21) Appl. No.: 16/069,914

(22) PCT Filed: Jan. 19, 2017

(86) PCT No.: PCT/JP2017/001773
§ 371 (c)(1),
(2) Date: Jul. 13, 2018

(87) PCT Pub. No.: WO2017/145595
PCT Pub. Date: Aug. 31, 2017

(65) Prior Publication Data
US 2019/0035882 A1     Jan. 31, 2019

(30) Foreign Application Priority Data
Feb. 23, 2016  (JP) ................. 2016-032293

(51) Int. Cl.
*H01L 21/02*  (2006.01)
*H01L 29/06*  (2006.01)
(Continued)

(52) U.S. Cl.
CPC ........ *H01L 29/063* (2013.01); *H01L 21/0243* (2013.01); *H01L 21/0262* (2013.01);
(Continued)

(58) Field of Classification Search
CPC ............. H01L 29/063; H01L 21/02529; H01L 21/02579; H01L 21/0262; H01L 21/0475;
(Continued)

(56) References Cited

U.S. PATENT DOCUMENTS

2015/0048382 A1*  2/2015  Takeuchi ............ H01L 29/4236
                                                                257/77
2016/0104794 A1*  4/2016  Takeuchi ............ H01L 29/1608
                                                                257/77

FOREIGN PATENT DOCUMENTS

JP    2009-302091 A       12/2009
JP    2013118962 A  *   6/2013    ....... A61F 13/49406
JP    2017-005236 A       1/2017

* cited by examiner

*Primary Examiner* — Asok K Sarkar
*Assistant Examiner* — Dmitriy Yemelyanov
(74) *Attorney, Agent, or Firm* — Posz Law Group, PLC

(57) ABSTRACT

A method for manufacturing a compound semiconductor device includes: providing a semiconductor substrate including a foundation layer having a first conductivity type; forming a deep trench in the foundation layer; and forming a deep layer having a second conductivity type by introducing material gas of the compound semiconductor while introducing dopant gas into an epitaxial growth equipment to cause epitaxial growth of the deep layer in the deep trench. A period in which a temperature in the epitaxial growth equipment is increased to a temperature of the epitaxial growth of the deep layer is defined as a temperature increasing period. In the forming the deep layer, the deep layer is further formed in a bottom corner portion of the deep trench by starting the introducing of the dopant gas during the temperature increasing period and starting the introducing of the material gas after the temperature increasing period.

16 Claims, 4 Drawing Sheets

(51) Int. Cl.
*H01L 21/04* (2006.01)
*H01L 29/10* (2006.01)
*H01L 29/16* (2006.01)
*H01L 29/66* (2006.01)
*H01L 29/78* (2006.01)
*H01L 29/20* (2006.01)

(52) U.S. Cl.
CPC .. *H01L 21/02378* (2013.01); *H01L 21/02529* (2013.01); *H01L 21/02579* (2013.01); *H01L 21/049* (2013.01); *H01L 21/0475* (2013.01); *H01L 29/1095* (2013.01); *H01L 29/1608* (2013.01); *H01L 29/66068* (2013.01); *H01L 29/7813* (2013.01); *H01L 29/2003* (2013.01)

(58) Field of Classification Search
CPC ..... H01L 21/049; H01L 21/20; H01L 21/265; H01L 29/06; H01L 21/1095; H01L 29/12; H01L 29/1608; H01L 29/66068; H01L 29/78; H01L 29/7813; H01L 29/2003
See application file for complete search history.

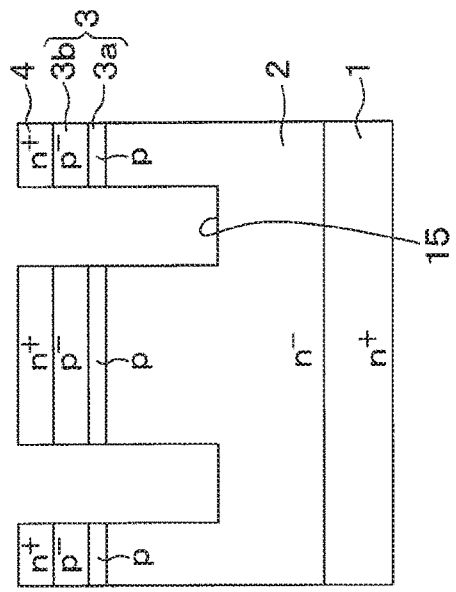
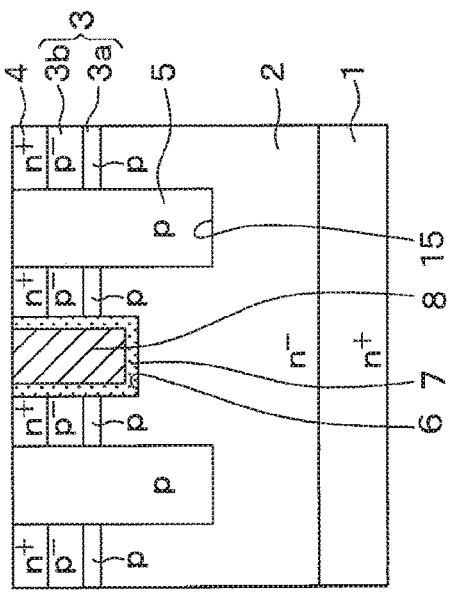
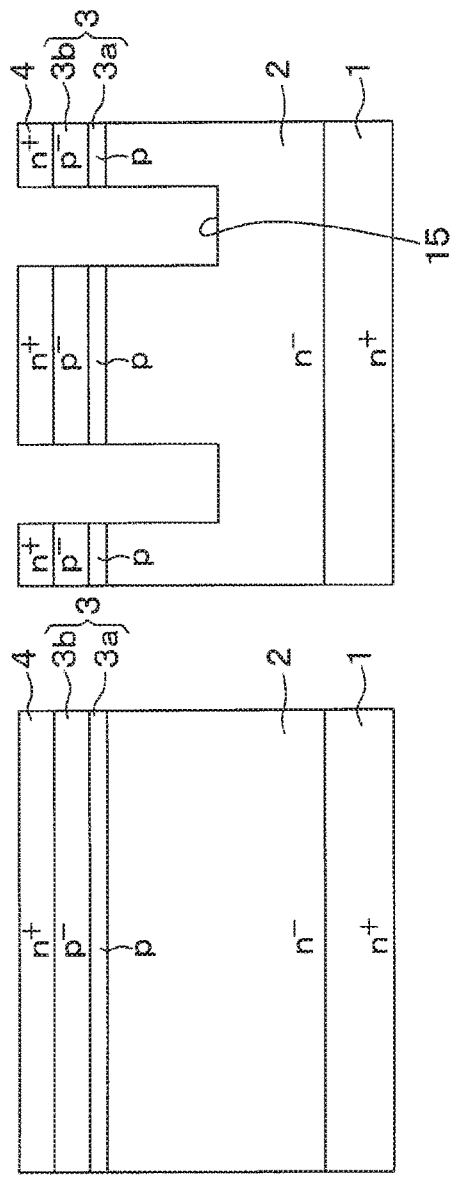
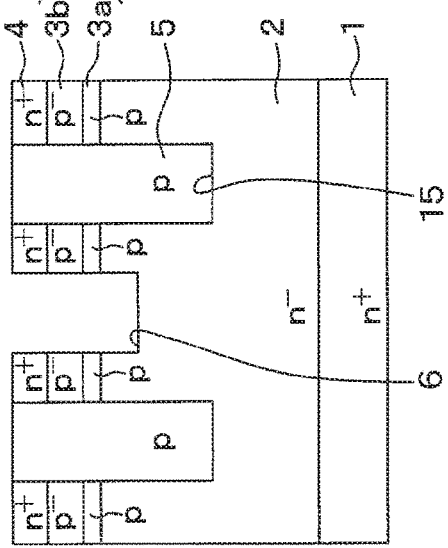
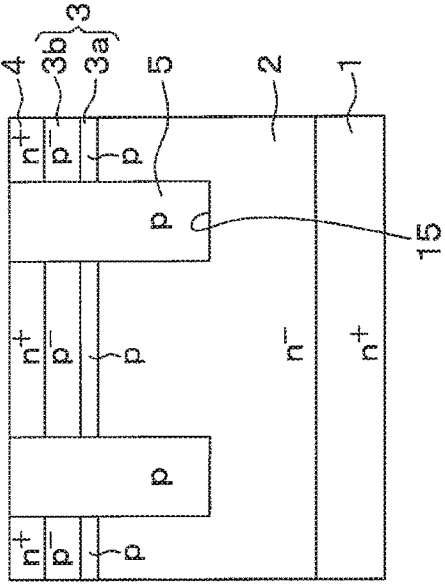

COMPOUND SEMICONDUCTOR DEVICE AND METHOD FOR MANUFACTURING THE SAME

CROSS REFERENCE TO RELATED APPLICATIONS

This application is a U.S. national phase of International Application No. PCT/JP2017/001773 filed on Jan. 19, 2017, and is based on Japanese Patent Application No. 2016-32293 filed on Feb. 23, 2016, the disclosure of which is incorporated herein by reference.

TECHNICAL FIELD

The present disclosure relates to a method for manufacturing a compound semiconductor device, and a compound semiconductor device, the device including a compound semiconductor such as silicon carbide (hereinafter referred to as SiC) and gallium nitride (hereinafter referred to as GaN).

BACKGROUND ART

Conventionally, patent literature 1 proposes an SiC semiconductor device including vertical metal-oxide-semiconductor field-effect transistor (MOSFET) having inverted type trench gate structure, as a vertical switching element having a trench gate structure. In the vertical MOSFET having the inverted type trench gate structure, a gate voltage is applied to a gate electrode in a gate trench, a channel is formed in a p-type base region located on a side surface of the gate trench, and a current is allowed to flow between a drain and a source through the channel. In such a vertical switching element having the trench gate structure, when a high electrical field is applied to a gate insulation film included in the trench gate structure, insulation breakdown is caused and element breakdown voltage is decreased.

In the SiC semiconductor device of the patent literature 1, a deep trench is formed at both sides across the trench gate structure. The deep trench penetrates an n$^+$-type source region and a p-type base region to reach an n$^-$-type drift layer and has a p-type deep layer in the deep trench. The p-type deep layer restricts the electrical field from breaking into the gate insulation film and protects the gate insulation film from the high electrical field. Accordingly, the insulation breakdown is less likely to be caused and the element breakdown voltage is improved.

PRIOR ART LITERATURE

Patent Literature

Patent Literature 1: JP 2014-236189 A

SUMMARY OF INVENTION

The p-type deep layer may be formed in the deep trench by an epitaxial growth under uniform concentration. In this case, process window for growth condition is narrow and there is a possibility that a corner portion of a bottom of the deep trench is changed to n-type. When the corner portion of the bottom of the deep trench is changed to n-type, the p-type layer cannot sufficiently restrict the electrical field from breaking into the trench gate structure and the breakdown voltage between the drain and the source in an off state is not sufficiently obtained.

For example, in an SiC substrate having Si surface, n-type dopant atom (e.g., nitrogen) is likely to be taken in a crystal plane orientation corresponding to the bottom corner portion of the deep trench. Therefore, it is contemplated that a slight amount of n-type dopant atom, which is included in an epitaxial growth equipment or SiC material gas, is taken in and causes the n-type transformation of the bottom corner portion of the deep trench. The n-type transformation of the bottom corner portion of the deep trench is restricted by using high purity material as the SiC material. In this case, however, it is difficult to prepare the high purity material and the cost is increased. The epitaxial growth of the p-type deep layer may be conducted under high temperature hydrogen atmosphere. In this case, however, equilibrium state is achieved between etching caused by hydrogen or high temperature and deposition of SiC, and crystal of SiC grows in the corner portion of the deep trench even before introducing the SiC material gas.

It is an object of the present disclosure to provide a method for manufacturing a compound semiconductor device and a compound semiconductor device capable of restricting decrease of breakdown voltage between a drain and a source.

According to an aspect of the present disclosure, a method for manufacturing a compound semiconductor device includes: providing a semiconductor substrate that includes a foundation layer having a first conductivity type and formed of a compound semiconductor; forming a deep trench in the foundation layer; and forming a deep layer that has a second conductivity type by introducing material gas of the compound semiconductor while introducing dopant gas including a second conductivity type dopant into an epitaxial growth equipment to cause epitaxial growth of the deep layer in the deep trench. A period in which a temperature in the epitaxial growth equipment is increased to a temperature of the epitaxial growth of the deep layer is defined as a temperature increasing period. In the forming the deep layer, the deep layer is further formed in a bottom corner portion of the deep trench by starting the introducing of the dopant gas including the second conductivity type dopant during the temperature increasing period and starting the introducing of the material gas after the temperature increasing period.

As described above, the introducing of the dopant gas including the second conductivity type dopant is started during the temperature increasing period and the introducing of the material gas is started after the temperature increasing period. As such, the deep layer is formed from a bottom corner portion of the deep layer, that is, the bottom corner portion of the deep trench. Therefore, the deep layer accurately restricts the electrical field from breaking into the trench gate structure and breakdown voltage between the drain and the source in an off state is secured.

According to another aspect of the present disclosure, a method for manufacturing a compound semiconductor device includes: providing a semiconductor substrate that includes a foundation layer having a first conductivity type and formed of a compound semiconductor; forming a deep trench in the foundation layer; and forming a deep layer that has a second conductivity type by introducing material gas of the compound semiconductor while introducing dopant gas including a second conductivity type dopant into an epitaxial growth equipment to cause epitaxial growth of the deep layer in the deep trench. A period in which a temperature in the epitaxial growth equipment is increased to a temperature of the epitaxial growth of the deep layer is defined as a temperature increasing period. In the forming the deep layer, the deep layer is further formed in a bottom corner portion of the deep trench by starting the introducing of the dopant gas including the second conductivity type dopant during the temperature increasing period and starting the introducing of the material gas during the temperature increasing period after the introducing the second conductivity type dopant gas.

As described above, the introducing of the dopant gas including the second conductivity type dopant is started during the temperature increasing period and the introducing of the material gas is started during the temperature increasing period after the introducing the second conductivity type dopant gas. As such, the deep layer is also formed from the bottom corner portion of the deep layer, that is, the bottom corner portion of the deep trench. Therefore, the deep layer accurately restricts the electrical field from breaking into the trench gate structure and the breakdown voltage between the drain and the source in the off state is secured.

BRIEF DESCRIPTION OF DRAWINGS

FIGS. 2A to 2E are cross-sectional views each illustrating a manufacturing step of the SiC semiconductor device shown in FIG. 1;

DESCRIPTION OF EMBODIMENTS

Embodiments according to the present disclosure will be hereinafter described with reference to the drawings. In the respective embodiments described herein, identical or equivalent parts are given identical reference numbers.

First Embodiment

An SiC semiconductor device that includes a vertical MOSFET having an inverted type trench gate structure according to the present disclosure will be described with reference to FIG. 1.

Figure 1:
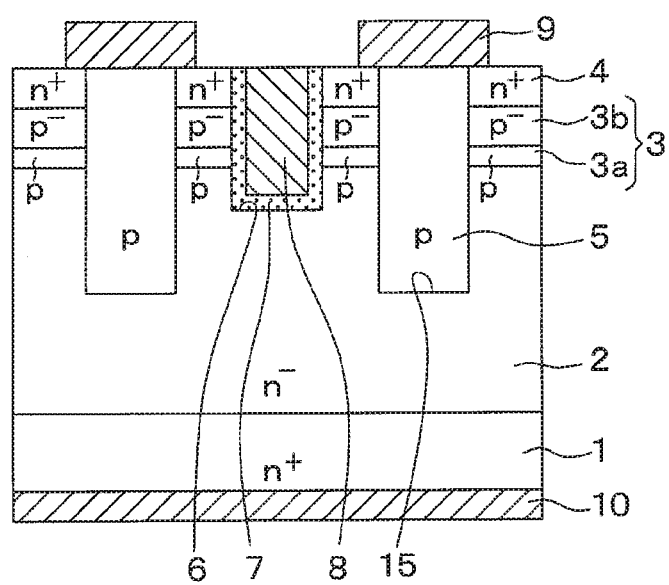
FIG. 1 is a cross-sectional view of an SiC semiconductor device including a vertical MOSFET according to a first embodiment.

An SiC semiconductor device illustrated in FIG. 1 includes a vertical MOSFET having a trench gate structure and disposed in a cell area. The SiC semiconductor device has an outer peripheral resistant structure, which is not shown, disposed in an outer peripheral area surrounding the cell area.

The SiC semiconductor device has a semiconductor substrate that includes an $n^+$-type substrate 1 providing a high concentration impurity layer formed of SiC, and an $n^-$-type drift layer 2 disposed on a front face side of the $n^+$-type substrate 1 and formed of SiC having an impurity concentration lower than the impurity concentration of the $n^+$-type substrate 1. For example, the $n^+$-type substrate 1 has an n-type impurity concentration of $1.0 \times 10^{19}/cm^3$, and a front face constituted by (0001) Si face. For example, the $n^-$-type drift layer 2 has an n-type impurity concentration in a range from $0.5 \times 10^{16}/cm^3$ to $2.0 \times 10^{16}/cm^3$.

On the $n^-$-type drift layer 2, a base region 3 is formed. In the present embodiment, the base region 3 includes a high concentration base region 3a and a low concentration base region 3b stacked in order. The high concentration base region 3a is formed of p-type SiC having higher impurity concentration than the $n^-$-type drift layer 2. The high concentration base region 3a has relatively high p-type impurity concentration and the low concentration base region 3a has p-type impurity concentration than the high concentration base region 3a.

For example, the high concentration base region 3a has p-type impurity concentration equal to or greater than $5 \times 10^{17}/cm^3$. For example, the high concentration base region 3a has p-type impurity concentration of $1 \times 10^{18}/cm^3$ and a thickness of 50 to 200 nm (nanometers). For example, the low concentration base region 3a has p-type impurity concentration equal to or lower than $1.0 \times 10^{16}/cm^3$ and a thickness of 0.2 to 1.0 μm (micrometers).

Furthermore, on the base region 3, an $n^+$-type source region 4 is formed. A p-type deep layer 5 is formed to extend from a surface of the $n^+$-type source region 4 to reach the $n^-$-type drift layer 2 and penetrate the $n^+$-type source region 4 and the base region 3. Specifically, a deep trench 15 is formed to extend from a surface of the $n^+$-type source region 4 to reach the $n^-$-type drift layer 2 and penetrate the $n^+$-type source region 4 and the base region 3. The p-type deep layer 5 is buried in the deep trench 15. For example, the deep trench 15 has a depth with aspect ratio equal to or greater than 2.

The $n^+$-type source region 4 is located at both sides of a trench gate structure, which will be described later. The p-type deep layer 5 is located at an opposite side of the trench gate structure across the $n^+$-type source region 4. The p-type deep layer 5 extends to a position deeper than the trench gate structure. The p-type deep layer 5 is buried in corner portions of a bottom of the deep trench 15. That is, the corner portion of the bottom of the deep trench 15 is not changed to n-type and the deep trench 15 is filled with the p-type deep layer 5. For example, the $n^+$-type source region 4 has n-type impurity concentration from $2.5 \times 10^{18}/cm^3$ to $1.0 \times 10^{19}/cm^3$ at a surface layer portion and has a thickness around 0.5 micrometers. The p-type deep layer 5 has impurity concentration greater than 3. For example, the p-type deep layer 5 has p-type impurity concentration from $1.0 \times 10^{17}/cm^3$ to $1.0 \times 10^{19}/cm^3$. In the present embodiment, the p-type deep layer 5 also functions as a contact region electrically connected to a source electrode 9, which will be described later.

A trench 6 is formed to penetrate the base region 3 and the $n^+$-type source region 4 and reach the $n^-$-type drift layer 2. The trench 6 has a longitudinal direction in a vertical direction of a sheet of FIG. 1. The high concentration base region 3a and the low concentration base region 3a of the base region 3 and the $n^+$-type source region 4 are disposed to be in contact with side surfaces of the trench 6.

A surface layer portion of a part of the base region 3 between the $n^+$-type source region 4 and the $n^-$-type drift layer 2 functions as a channel region and the channel region is included in the trench 6. A gate insulation film 7 is formed on an inner wall surface of the trench 6. On a surface of the gate insulation film 7, a gate electrode 8 formed of doped Poly-Si is formed. The trench 6 is filled with the gate insulation film 7 and the gate electrode 8.

The trench gate structure is configured as described above. The trench gate structure extends in a longitudinal direction coinciding with the vertical direction of FIG. 1. A plurality of the trench gate structures are arranged in the left-right direction of FIG. 1 to constitute a stripe form. The $n^+$-type source region 4, the p-type deep layer 5 described above constitute a layout structure extending in the longitudinal direction of the trench gate structure.

A source electrode 9 and gate wiring (not shown) are further formed on front faces of the $n^+$-type source region 4 and the p-type deep layer 5, and the front face of the gate electrode 8. Each of the source electrode 9 and the gate wiring contains plural types of metal, such as Ni/Al. The plural types of metal at least in a part being in contact with n-type SiC, more specifically, in contact with the $n^+$-type source region 4 or the gate electrode 8 in a case of n-type doping contain metal capable of achieving ohmic contact with n-type SiC. The plural types of metal at least in a part being in contact with p-type SiC, more specifically, in contact with the p-type deep layer 5 is constituted by metal capable of achieving ohmic contact with p-type SiC. Each of the source electrode 9 and the gate wiring is provided on an interlayer insulation film (not shown) for electrically isolation. Electric contacts between the source electrode 9 and each of the $n^+$-type source region 4 and the p-type deep layer 5, and between the gate wiring and the gate electrode 8 are achieved via contact holes formed in the interlayer insulation films.

A drain electrode 10 electrically connected to the $n^+$-type substrate 1 is further formed on a rear face side of the $n^+$-type substrate 1. The vertical MOSFET having the n-channel type and inverted type trench gate structure is constructed as above. An outer peripheral resistant structure (not shown) is disposed in the outer peripheral area of the cell area containing the vertical MOSFET to constitute the SiC semiconductor device of the present embodiment.

According to the vertical MOSFET included in the SiC semiconductor device and having the inverted type trench gate structure configured as above, a channel area is formed in a front face of a portion included in the base region 3 and coming into contact with the trench 6 when a gate voltage is applied to the gate electrode 8. In this case, such an action is caused that allows electrons injected from the source electrode 9 to pass through the $n^+$-type source region 4 and the channel area formed in the base region 3, and reach the $n^-$-type drift layer 2, thereby manufacturing a current flow between the source electrode 9 and the drain electrode 10.

In the SiC semiconductor device according to the present embodiment, the p-type deep layer 5 is buried in the corner portion of the deep trench 15 and n-type layer is not formed in the corner portion of the deep trench 15. By this configuration, the p-type deep layer 5 accurately provides effect of restricting the electrical field from breaking into the trench gate structure. That is, the breakdown voltage between the drain and the source is obtained in an off state.

In the present embodiment, the base region 3 includes the high concentration base region 3a and the low concentration base region 3a and the high concentration base region 3a and the low concentration base region 3a form the channel. Therefore, the high concentration base region 3a restricts spreading of depletion layer in the base region 3. The base region 3 is restricted from being completely depleted and the punch through is restricted. That is, the element breakdown voltage can be secured and degradation of the gate insulation film 7 at the bottom of the trench 6 can be restricted. Additionally, the high threshold voltage can be obtained because the threshold voltage depends on p-type impurity concentration of the base region 3.

Since channel mobility is increased in the low concentration base region 3a, on resistance can be reduced even through the high concentration base region 3a is formed. Accordingly, the vertical MOSFET having the trench gate structure capable of reducing on-resistance, securing the element breakdown voltage, and high threshold voltage can be obtained.

In the off state, the high concentration base region 3a enhances the effects of withdrawing carriers caused by junction of the $n^-$-type drift layer 2 and the base region 3. Therefore, the high concentration base region 3a can reduce drain leak current.

The entire part of the base region 3 being in contact with the $n^-$-type drift layer 2 is provided by the high concentration base region 3a having high p-type impurity concentration. Rising voltage of current flowing in a built-in diode, which is provided by PN junction of the $n^-$-type drift layer 2 and the base region 3, can be reduced. Accordingly, on voltage of the built-in diode can be reduced and loss in synchronous rectified driving can be reduced by actively using the built-in diode.

Additionally, in the off state, the depletion layer extending from the high concentration base region 3a toward the $n^-$-type drift layer 2 restricts equipotential lines from entering under the trench gate structure. Therefore, the concentration of the electrical field applied to the gate insulation film 7 at the bottom of the trench 6 is eased, the life of the gate insulation film 7 is improved and reverse bias life is improved.

A method for manufacturing the SiC semiconductor device configured as illustrated in FIG. 1 according to the present embodiment is now described with reference to FIGS. 2A to 2E and FIG. 3.

[Step Shown in FIG. 2A]

A semiconductor substrate is initially provided. This semiconductor substrate is an epitaxial substrate that includes the $n^+$-type substrate 1 containing SiC, and the $n^-$-type drift layer 2 containing SiC and formed by epitaxial growth on the front face of the $n^+$-type substrate 1. Then, the epitaxial substrate is located in an epitaxial growth equipment and epitaxial growth of each of the high concentration base region 3a, the low concentration base region 3a and the $n^+$-type source region 4 is sequentially conducted on the front face of the $n^-$-type drift layer 2.

[Step Shown in FIG. 2B]

A mask member (not shown) is disposed on the front face of the $n^+$-type source region 4, and then a predetermined position for forming the p-type deep layer 5 is opened in the mask member by photolithography. In the state that the mask member is disposed, anisotropic etching such as reactive ion etching (RIE) is performed to form the deep trench 15 at the predetermined position for forming the p-type deep layer 5.

[Step Shown in FIG. 2C]

The process forming the p-type deep layer 5 is sequentially performed by using the unillustrated epitaxial growth equipment.

Figure 3:
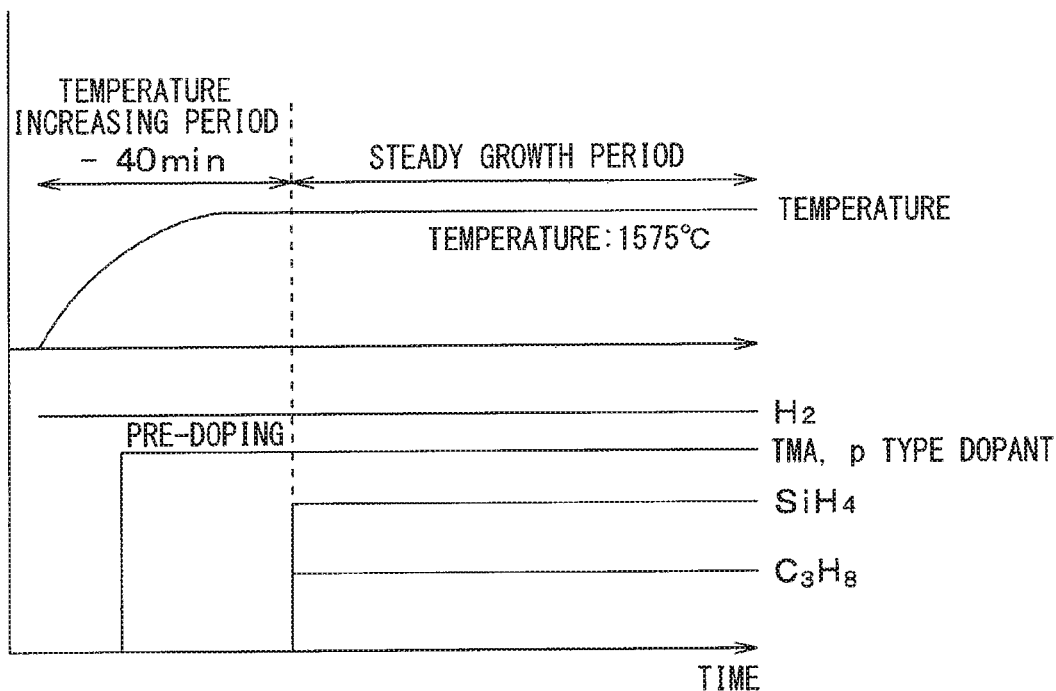
FIG. 3 is a timing chart illustrating a growth program of a p-type deep layer in a deep trench according to the first embodiment.

Specifically, as shown in FIG. 3, the temperature in the epitaxial growth equipment is increased to, for example, 1575° C. (degrees Celsius) as a temperature increasing period. For example, the temperature increasing period is equal to or less than 40 minutes. In this case, before introducing SiC material gas, pre-doping is performed to preliminarily introduce dopant gas including p-type dopant. Then, the SiC material gas is introduced after the pre-doping to cause epitaxial growth of the p-type deep layer 5.

For example, silane ($SiH_4$) constituting an Si material, and propane ($C_3H_8$) constituting a C material are employed as the SiC material gas. The dopant gas employed for forming the p-type deep layer 5 is TMA (trimethylaluminum) containing p-type dopant. For example, hydrogen ($H_2$) as an etching gas is further introduced as necessary.

When the pre-doping of the p-type dopant is performed before introducing the SiC material gas, the p-type deep layer 5 is formed without n-type transformation of the bottom corner portion of the deep trench 15. That is, crystal growth of SiC progresses by the p-type dopant preliminarily introduced in the pre-doping and taken in. The crystal growth of SiC progresses based on Si element or C element existing by sublimation into atmosphere before introducing the SiC material gas. Alternatively, the crystal growth of SiC progresses in initial stage when the SiC material gas is introduced. In this case, the p-type deep layer 5 is formed from the bottom corner portion of the deep trench 15. Therefore, the n-type transformation of the SiC at the corner portion of the deep trench 15 is accurately restricted.

Especially, the equilibrium state between the etching and the SiC deposition is achieved during the temperature increasing period by introducing etching gas as necessary and performing temperature increasing under etching gas atmosphere (e.g., hydrogen gas atmosphere). In this case, SiC grows at the corner portion of the deep trench 15 even before introducing the SiC material gas. By performing the pre-doping of the p-type dopant, the n-type transformation of SiC at the corner portion of the deep trench 15 is accurately restricted.

Suppose that organometallic material is doped as the p-type dopant. In this case, start-up delay requiring time until desired p-type impurity concentration is obtained occurs. The start-up delay is caused by sticking of the dopant on an inner wall of a chamber of the epitaxial growth equipment in the initial stage of gas introducing. In the pre-doping, a pre-doping time and the introducing amount of TMA are controlled. As such, the impurity concentration of the p-type deep layer 5 is suitably controlled and the p-type deep layer 5 is formed to have the desired p-type impurity concentration.

After introducing the SiC material gas, a ratio of the dopant gas, the SiC material gas, and the etching gas, which is introduced as necessary, is stabilized at the desired ratio. The time period in which the gas ratio is stabilized is defined as a steady growth period and the p-type deep layer 5 is formed to fill the deep trench 15 during the steady growth period.

Then, the p-type impurity layer formed on the $n^+$-type source region 4 in the forming of the p-type deep layer 5 is removed to expose the surface of the $n^+$-type source region 4 by planarization such as grinding or CMP (Chemical Mechanical Polishing). Accordingly, the p-type deep layer 5 is only located in the deep trench 15.

[Step Shown in FIG. 2D]

A mask member (not shown) is disposed on the front faces of the $n^+$-type source region 4 and the p-type deep layer 5, and then a predetermined position for forming the trench 6 is opened in the mask member by photolithography. In the state that the mask member is disposed, anisotropic etching such as RIE is performed to form the trench 6 in the cell area. Thereafter, the mask member is removed.

Hydrogen etching is carried out as necessary by heating in a hydrogen atmosphere at 1600° C. (degrees Celsius) or higher and under depressurization, such as a high-temperature hydrogen atmosphere at 1625° C. and $2.7 \times 10^4$ Pa (=200 Torr). This hydrogen etching achieves rounding of the inner wall surface of the trench 6, i.e., rounding an opening inlet or a corner portion of the trench 6, and removing damage caused by trench etching.

[Step Shown in FIG. 2E]

The gate insulation film 7 is formed by thermal oxidation in a wet atmosphere. Thereafter, a doped Poly-Si layer is formed on the front face of the gate insulation film 7, and patterned such that the doped Poly-Si layer remains inside the trench 6 and constitutes the gate electrode 8.

Steps after this step are similar to steps conventionally performed. More specifically, a step for forming interlayer insulation films, a step for forming contact holes by photo-etching, a step for forming the source electrode 9 and the gate wiring layer by patterning after deposition of electrode material, a step for forming the drain electrode 10 on the rear face of the $n^+$-type substrate 1, and other steps are performed. As a result, the SiC semiconductor device that includes the vertical MOSFET having the trench gate structure in FIG. 1 and disposed in the cell area is completed.

As described hereinabove, in the SiC semiconductor device including the vertical MOSFET according to the present embodiment, the p-type deep layer 5 is formed from the bottom corner portion of the p-type deep layer 5, that is, the p-type deep layer 5 is formed from the bottom corner portion of the deep trench 15. The p-type deep layer 5 can accurately restrict the electrical field from breaking into the trench gate structure, and the breakdown voltage between the drain and the source is obtained in the off state.

In the method for manufacturing the SiC semiconductor device according to the present embodiment, in the forming of the p-type deep layer 5, the p-type dopant is preliminarily doped before introducing the SiC material gas. The p-type deep layer 5 is formed at the bottom corner portion of the deep trench 15 based on Si element or C element existing by sublimation into atmosphere or in the initial stage when the SiC material gas is introduced. Accordingly, the n-type transformation of the SiC in the corner portion of the deep trench 15 is accurately restricted.

Second Embodiment

A second embodiment will be described. In the present embodiment, the introducing method of the SiC material gas is changed from the first embodiment. Since the other parts are similar to the first embodiment, only parts different from the first embodiment will be described.

Figure 4:
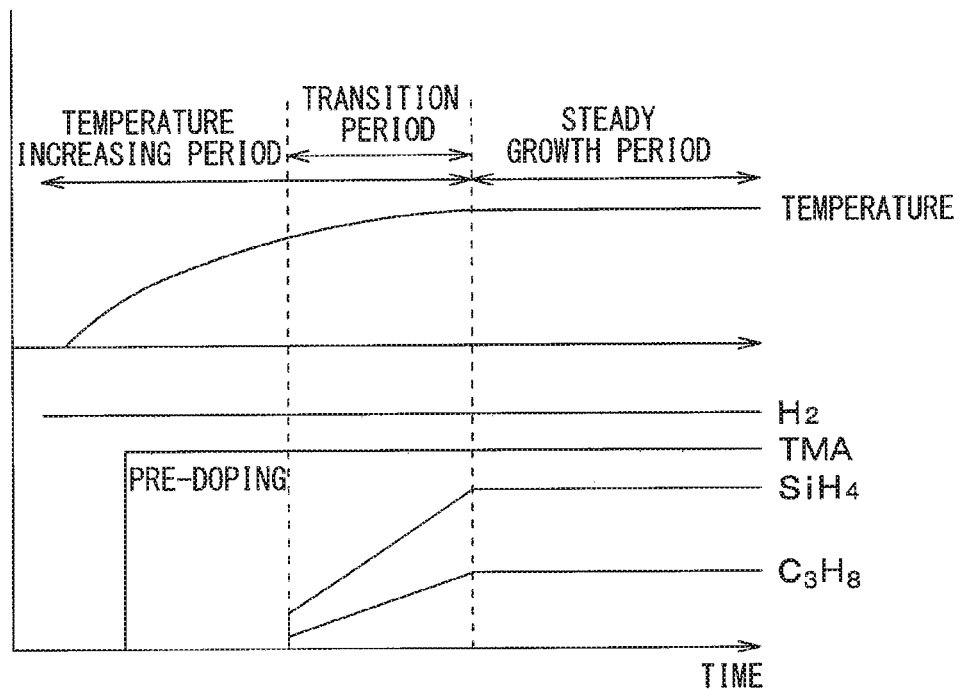
FIG. 4 is a timing chart illustrating a growth program of a p-type deep layer in a deep trench according to a second embodiment.

As shown in FIG. 4, the introduction of the SiC material gas is started during the temperature increasing period. The introducing amount of the SiC material gas is decreased in the initial stage of the introducing and then gradually increased toward the desired introducing amount. The period in which the introducing amount of the SiC material gas is gradually increased is defined as a transition period and the period after the introducing amount of the SiC becomes constant is defined as a steady growth period. During the transition period, the epitaxial growth is conducted moderately. During the steady growth period, the epitaxial growth is conducted with desired growth rate, e.g., up to 4 μm/h. For example, the transition period is 30 seconds and, during the transition period, the introducing amount of silane is gradually increased from 50 ppm to 200 ppm and the introducing amount of propane is gradually increased from 15 ppm to 60 ppm.

By starting the introduction of the SiC material gas during the temperature increasing period, step bunching in the exposed surface is restricted. Also, the introducing amount of the SiC material gas is gradually increased. As such, degradation of crystallinity of growing crystal, which is caused by rapidly increasing the introducing amount of the SiC material gas during the transition period, is restricted. The epitaxial growth is conducted with the desired rate after the epitaxial growth progresses to an extent in which the degradation of crystallinity is less likely to occur. Since the step bunching in the exposed surface and the degradation of crystallinity of the growing crystal are restricted, excellent flatness and crystallinity of the surface of the trench 6 are achieved. Accordingly, membrane quality of the gate insulation film 7 formed on the inner wall surface of the trench 6 is improved and reliability of the gate insulation film 7 is improved.

Third Embodiment

A third embodiment will be described. In the present embodiment, the structure of the p-type deep layer 5 and the introducing method of the SiC material gas are changed from the first embodiment and the second embodiment. Since the other parts are similar to the first embodiment and the second embodiment, parts different from the first embodiment and the second embodiment will be described. In the present embodiment, examples in which the introducing amount of the SiC material gas is changed similarly to the second embodiment. However, the introducing amount of the SiC may be constant similarly to the first embodiment.

Figure 5:
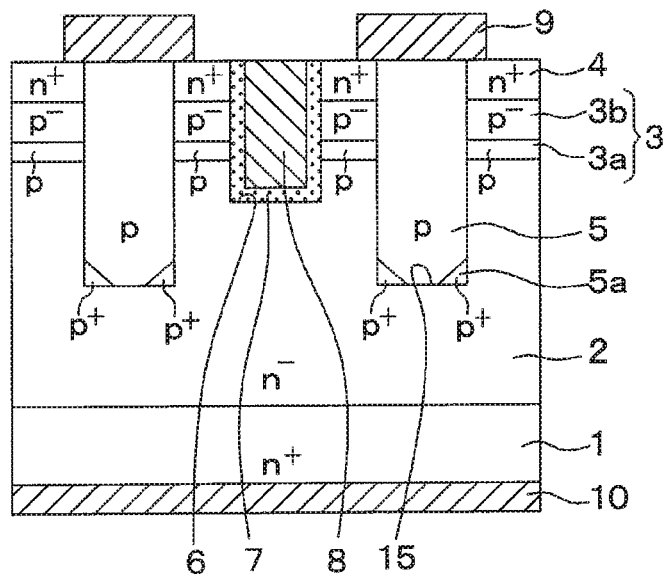
FIG. 5 is a cross-sectional view of an SiC semiconductor device including a vertical MOSFET according to a third embodiment.

As shown in FIG. 5, in the present embodiment, the bottom corner portion of the p-type deep layer 5, in other words, the bottom corner portion of the deep trench 15 is provided by a $p^+$-type region 5a. The $p^+$-type region 5a is located below the base region 3 and separated from the base region 3. However, the $p^+$-type region 5a may be connected to the base region 3. For example, the $p^+$-type region 5a has p-type impurity concentration from $1.0\times10^{17}/cm^3$ to $1.0\times10^{19}/cm^3$. The $p^+$-type region 5a has a cross-section shape of triangular shape or triangular round shape. The triangular round shape is a shape in which a part of triangle being in contact with the p-type deep layer 5 is concaved and rounded. The impurity concentration of the $p^+$-type region 5a is not necessarily uniform. The $p^+$-type region 5a may have a concentration distribution in which the impurity concentration is gradually decreased with a distance from the corner portion of the deep trench 15 and is decreased to the impurity concentration of the other region of the p-type deep layer 5. As described above, the p-type deep layer 5 has the highest p-type impurity concentration at the bottom corner portion due to the $p^+$-type region 5a.

According to the SiC semiconductor device having such structure, the effects of the p-type deep layer 5 restricting the electrical field from breaking into the trench gate structure is further enhanced and the breakdown voltage between the drain and the source is further improved. Additionally, breakdown can be intentionally caused in the $p^+$-type region 5a where the p-type impurity concentration is increased. Therefore, the breakdown is less likely to occur in the MOS structure portion, that is, the trench gate structure portion. Especially, in cases where the SiC semiconductor device is employed as a switching element for large switching surge such as L load, it is preferable to allow the breakdown current to flow not only in the outer peripheral region but also the cell region and to receive the surge current by the entire surface of the substrate. Therefore, by allowing the breakdown current to flow in the cell region and disallowing the breakdown current to flow in the MOS structure portion, the reliability of the vertical MOSFET is improved the resistance extent against the L load is improved.

Next, the method for manufacturing the SiC semiconductor device according to the present embodiment will be described. Although the method for manufacturing the SiC semiconductor device in the present embodiment is basically similar to the first embodiment and the second embodiment, the introducing amount of the dopant gas in the pre-doping is different.

Figure 6:
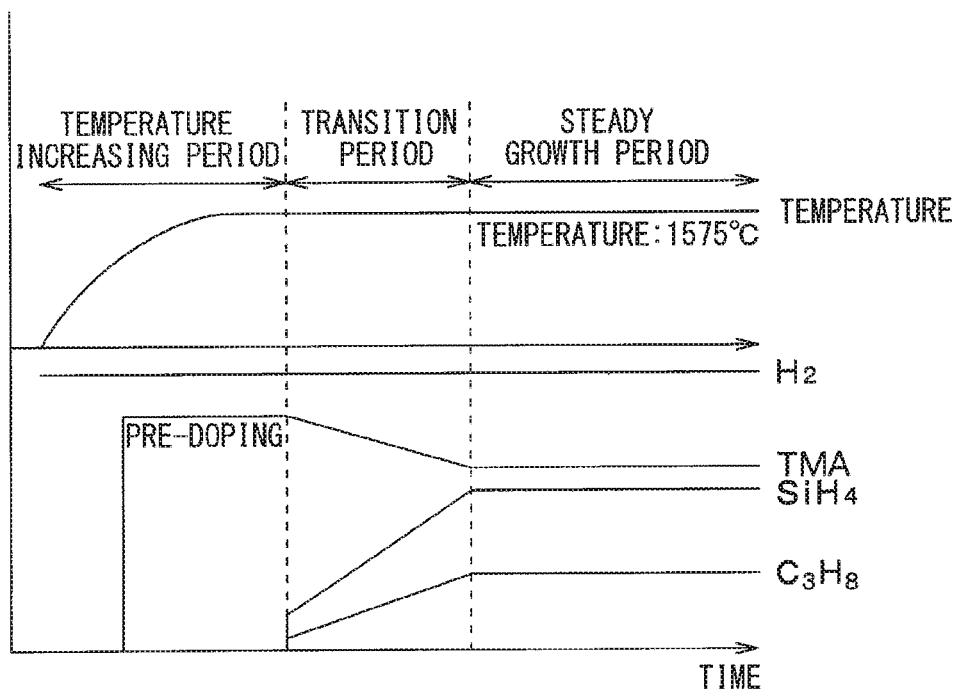
FIG. 6 is a timing chart illustrating a growth program of a p-type deep layer in a deep trench according to the third embodiment.

For example, as shown in FIG. 6, the introducing amount of the dopant gas including the p-type dopant during the pre-doping is greater than the introducing amount during the steady growth period. In the transition period after the introducing of the SiC material gas is started, the introducing amount of the dopant gas is decreased compared to the introducing amount before introducing the SiC material gas. Furthermore, the introducing amount of the dopant gas is gradually decreased during the transition period and is decreased to the introducing amount during the steady growth period.

In cases where the introducing amount of the dopant gas is increased to the maximum during the pre-doping, the $p^+$-type region 5a can be formed at the bottom of the deep trench 15 based on Si element or C element existing by sublimation into atmosphere before introducing the SiC material gas, or in initial stage when the SiC material gas is introduced.

In this case, the $p^+$-type region 5a is formed to have high impurity concentration due to the p-type dopant that is preliminarily introduced during the pre-doping and taken in and thus, the p-type deep layer 5 has the impurity concentration higher than the region of the p-type deep layer 5 other than the $p^+$-type region 5a. Since the introducing amount of the dopant gas during the pre-doping is increased than the period after the pre-doping. The p-type impurity concentration of the $p^+$-type region 5a is further increased. Accordingly, the n-type transformation of the SiC at the corner portion of the deep trench 15 is further restricted.

Although the introducing amount of the dopant gas is increased during the temperature increasing period, the introducing amount of the dopant gas is decreased thereafter. Therefore, it is restricted that the entire region of the p-type deep layer 5 is provided by a region where the p-type impurity concentration is excessively increased, and the impurity concentration of the entire region of the p-type deep layer 5 other than the $p^+$-type region 5a is uniformed. Accordingly, degradation of the element breakdown voltage caused by the increasing of the concentration distribution of the region of the p-type deep layer 5 other than the $p^+$-type region 5a is restricted.

Other Embodiments

Although the present disclosure is described based on the above embodiments, the present disclosure is not limited to the specific embodiments and may include various modified examples or modifications within a range of equivalency. In addition, various combinations and modes, and other combinations and modes including only a single element, or more or less elements, are all included in the scope and the range of spirit of the present disclosure.

For example, according to the respective embodiments described above, the $n^+$-type source region 4 is formed by epitaxial growth. However, the $n^+$-type source region 4, which is only required to be formed in an upper layer part of the base region 3, may be formed by other methods such as ion implantation.

According to the first and second embodiments, the base region 3 is divided into the high concentration base region 3a and the low concentration base region 3a. However, the base region 3 may have a uniform impurity concentration. According to the configuration having different impurity concentrations, the impurity concentration may gradually change in the boundary portion between the high concentration base region 3a and the low concentration base region 3a. In this case, the high concentration base region 3a and the low concentration base region 3a having different p-type impurity concentrations may be stacked on each other with the boundary portion interposed between the high concentration base region 3a and the low concentration base region 3a. In a different mode, the low concentration base region 3a may be constituted by an i-type semiconductor in a non-doped state, i.e., in a state containing substantially no p-type dopant. For example, the dope quantity of the low concentration base region 3a may be only a quantity sufficient for doping p-type dopant remaining in the atmosphere during epitaxial growth. In this case, channel mobility in the low concentration base region 3a further increases, wherefore on-resistance further decreases.

According to the respective embodiments described herein by way of example, the n⁻-type drift layer 2 is formed on the front face of the n⁺-type substrate 1 to constitute a structure of a semiconductor substrate that includes a higher impurity concentration rear face layer on the rear face side, and a drift layer disposed on the front face side and having an impurity concentration lower than the impurity concentration of the rear face layer. However, this structure is presented only by way of example of the semiconductor substrate. For example, the semiconductor substrate may include a high-concentration impurity layer produced by ion implantation of n-type dopant or by epitaxial growth on a rear face side of a substrate constituted by the n⁻-type drift layer 2.

According to the n-channel type vertical MOSFET in the respective embodiments described herein by way of example, n-type is designated as a first conductive type, while p-type is designated as a second conductive type. However, the present disclosure is applicable to a p-channel type vertical MOSFET that includes constituent elements whose conductive types are inverted. In this case, a plane orientation of a front face of a semiconductor substrate is shifted from the respective embodiments described above by 90 degrees to allow dominant epitaxial growth of p-type limiting layers on side faces of a deep trench, and dominant epitaxial growth of an n-type deep layer on a bottom of the deep trench.

According to the respective embodiments described above by way of example, SiC is adopted as a compound semiconductor. The formed on the n⁻-type drift layer 2 as a foundation layer is presented by way of example of epitaxial growth of a second conductive type deep layer within a deep trench. However, this configuration is also presented only by way of example. The present disclosure is applicable to a structure that includes a deep trench formed for a first conductive type foundation layer containing a compound semiconductor, and a deep layer constituted by a second conductive type compound semiconductor and formed by epitaxial growth within the deep trench.

The invention claimed is:

1. A method for manufacturing a compound semiconductor device, the method comprising:
   providing a semiconductor substrate that includes a foundation layer having a first conductivity type and formed of a compound semiconductor;
   forming a deep trench in the foundation layer; and
   forming a deep layer that has a second conductivity type by introducing material gas of the compound semiconductor while introducing dopant gas including a second conductivity type dopant into an epitaxial growth equipment and causing epitaxial growth of the deep layer in the deep trench, wherein
   a period in which a temperature in the epitaxial growth equipment is increased to a temperature of the epitaxial growth of the deep layer is defined as a temperature increasing period, and
   in the forming the deep layer, the deep layer is further formed in a bottom corner portion of the deep trench by:
   starting the introducing of the dopant gas including the second conductivity type dopant during the temperature increasing period; and
   starting the introducing of the material gas after the temperature increasing period.

2. A method for manufacturing a compound semiconductor device, the method comprising:
   providing a semiconductor substrate that includes a foundation layer having a first conductivity type and formed of a compound semiconductor;
   forming a deep trench in the foundation layer; and
   forming a deep layer that has a second conductivity type by introducing material gas of the compound semiconductor while introducing dopant gas including a second conductivity type dopant into an epitaxial growth equipment and causing epitaxial growth of the deep layer in the deep trench, wherein
   a period in which a temperature in the epitaxial growth equipment is increased to a temperature of the epitaxial growth of the deep layer is defined as a temperature increasing period, and
   in the forming the deep layer, the deep layer is further formed in a bottom corner portion of the deep trench by:
   starting the introducing of the dopant gas including the second conductivity type dopant during the temperature increasing period; and
   starting the introducing of the material gas during the temperature increasing period after the introducing of the second conductivity type dopant gas.

3. The method for manufacturing the compound semiconductor device according to claim 1, wherein
   the compound semiconductor device includes a switching element having a trench gate structure,
   the method comprises:
   providing the semiconductor substrate that includes a rear surface layer disposed on a rear side of the semiconductor substrate and a drift layer disposed on a front side of the semiconductor substrate, the drift layer providing the foundation layer, having the first conductivity type, and having an impurity concentration lower than the rear surface layer;
   forming a base region on the drift layer, the base region having the second conductivity type;
   forming a source region above the base region, the source region having the first conductivity type and an impurity concentration higher than the drift layer;
   forming a gate trench that extends from a surface of the source region to a position deeper than the base region;
   forming the trench gate structure by forming a gate insulation film on an inner wall surface of the gate trench and forming a gate electrode on the gate insulation film;

forming a source electrode that is electrically connected to the source region; and forming a drain electrode that is electrically connected to the rear surface layer at the rear side of the semiconductor substrate, and in the forming the deep trench, the deep trench is formed to be deeper than the gate trench in the drift layer.

4. The method for manufacturing the compound semiconductor device according to claim 1, wherein
in the forming the deep layer, the temperature in the epitaxial growth equipment is increased while introducing etching gas of the compound semiconductor.

5. The method for manufacturing the compound semiconductor device according to claim 1, wherein
in the forming the deep layer, when the introducing of the material gas is started, an introducing amount of the dopant gas is decreased compared to an introducing amount of the dopant gas before the introducing of the material gas is started.

6. The method for manufacturing the compound semiconductor device according to claim 1, wherein
in the forming the deep layer, an introducing amount of the material gas is gradually increased and then kept constant.

7. The method for manufacturing the compound semiconductor device according to claim 1, wherein
trimethylaluminum is used as the dopant gas.

8. The method for manufacturing the compound semiconductor device according to claim 1, wherein
in the forming the deep layer, a second conductivity type impurity concentration of the deep layer is maximized at the bottom corner portion of the deep trench.

9. A compound semiconductor device comprising:
a semiconductor substrate that includes a foundation layer having a first conductivity type and formed of a compound semiconductor; and
a deep layer that has a second conductivity type and is disposed in a deep trench provided in the foundation layer,
wherein
the deep layer includes a high impurity concentration region disposed at a bottom corner portion of the deep trench, the high impurity concentration region has a second conductivity type impurity concentration higher than another region in the deep layer, and the high impurity concentration region has a cross-section shape of triangular shape or triangular round shape.

10. The compound semiconductor device according to claim 9, wherein
the compound semiconductor device comprises a vertical MOSFET that includes:
the semiconductor substrate including a rear surface layer disposed on a rear side of the semiconductor substrate and a drift layer disposed on a front side of the semiconductor substrate, the rear surface layer having a higher impurity concentration and the drift layer having a lower impurity concentration lower than the rear surface layer, the drift layer having the first conductivity type and providing the foundation layer;
a base region disposed on the drift layer and having the second conductivity type;
a source region disposed above the base region, having the first conductivity type, and having an impurity concentration higher than the drift layer;
a trench gate structure provided in a gate trench and including a gate insulation film and a gate electrode, the gate trench extending from a surface of the source region to a position deeper than the base region, the gate insulation film being disposed on an inner wall surface of the gate trench, and the gate electrode being disposed on the gate insulation film;
a source electrode electrically connected to the source region; and
a drain electrode electrically connected to the rear surface layer disposed on the rear side of the semiconductor substrate,
the deep trench penetrates the source region and the base region to reach the drift layer, and the deep layer is disposed in the deep trench.

11. The method for manufacturing the compound semiconductor device according to claim 2, wherein
the compound semiconductor device includes a switching element having a trench gate structure,
the method comprises:
providing the semiconductor substrate that includes a rear surface layer at a rear side and a drift layer at a front side, the drift layer providing the foundation layer, having the first conductivity type, and having an impurity concentration lower than the rear surface layer;
forming a base region that has the second conductivity type on the drift layer;
forming a source region that has the first conductivity type above the base region, the source region having an impurity concentration higher than the drift layer;
forming a gate trench that extends from a surface of the source region to a position deeper than the base region;
forming the trench gate structure by forming a gate insulation film on an inner wall surface of the gate trench and forming a gate electrode on the gate insulation film;
forming a source electrode that is electrically connected to the source region; and
forming a drain electrode that is electrically connected to the rear surface layer at the rear side of the semiconductor substrate, and
in the forming the deep trench, the deep trench is formed to be deeper than the gate trench in the drift layer.

12. The method for manufacturing the compound semiconductor device according to claim 2, wherein
in the forming the deep layer, the temperature in the epitaxial growth equipment is increased while introducing etching gas of the compound semiconductor.

13. The method for manufacturing the compound semiconductor device according to claim 2, wherein
in the forming the deep layer, when the introducing of the material gas is started, an introducing amount of the dopant gas is decreased compared to an introducing amount of the dopant gas before the introducing of the material gas is started.

14. The method for manufacturing the compound semiconductor device according to claim 2, wherein
in the forming the deep layer, an introducing amount of the material gas is gradually increased and then kept constant.

15. The method for manufacturing the compound semiconductor device according to claim 2, wherein
trimethylaluminum is used as the dopant gas.

16. The method for manufacturing the compound semiconductor device according to claim 2, wherein
in the forming the deep layer, a second conductivity type impurity concentration of the deep layer is maximized at the bottom corner portion of the deep trench.

* * * * *